(12) United States Patent
Itazawa

(10) Patent No.: US 8,295,052 B2
(45) Date of Patent: Oct. 23, 2012

(54) FLAT PANEL DISPLAY APPARATUS

(75) Inventor: Toshiaki Itazawa, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 968 days.

(21) Appl. No.: 12/051,761

(22) Filed: Mar. 19, 2008

(65) Prior Publication Data

US 2008/0310092 A1 Dec. 18, 2008

(30) Foreign Application Priority Data

Mar. 20, 2007 (JP) ................................. 2007-072497

(51) Int. Cl.
*H05K 5/00* (2006.01)

(52) U.S. Cl. ........................................ 361/752; 361/688

(58) Field of Classification Search ................... 349/60, 349/59

See application file for complete search history.

(56) References Cited

U.S. PATENT DOCUMENTS

| | | | | |
|---|---|---|---|---|
| 5,986,726 A | * | 11/1999 | Murai | 349/59 |
| 6,067,133 A | * | 5/2000 | Niibori et al. | 349/60 |
| 2002/0067591 A1 | * | 6/2002 | Tajima | 361/681 |
| 2003/0020152 A1 | * | 1/2003 | Inoue et al. | 257/684 |
| 2005/0243106 A1 | * | 11/2005 | Bae et al. | 345/679 |
| 2007/0127215 A1 | * | 6/2007 | Jeong | 361/710 |

FOREIGN PATENT DOCUMENTS

| | | |
|---|---|---|
| JP | 11-242442 | 9/1999 |
| JP | 2000-137446 A | 5/2000 |
| JP | 2006-65120 | 3/2006 |

* cited by examiner

*Primary Examiner* — Tuan T Dinh
*Assistant Examiner* — Steven Sawyer
(74) *Attorney, Agent, or Firm* — Canon USA Inc IP Division

(57) ABSTRACT

A flat panel display apparatus includes a display panel, a chassis configured to support a backside of the display panel, and a flexible circuit board on which a driving circuit for driving the display panel is mounted. The chassis includes a first flat plate bonded to the display panel on a surface side, and a second flat plate bonded to a front cover arranged on the surface side of the display panel. The flexible circuit board has one end connected to the display panel, and another end arranged between the first and second flat plates. The second flat plate includes a plurality of flange portions formed to be bonded to the front cover.

7 Claims, 9 Drawing Sheets

FLAT PANEL DISPLAY APPARATUS

BACKGROUND OF THE INVENTION

1. Field of the Invention

The present invention relates to a casing structure of a flat panel display apparatus (FPD), and more particularly to a chassis structure of the FPD and a mounting form of electric components.

2. Description of the Related Art

FIG. 7 illustrates a conventional casing structure of an FPD which uses a display panel such as a plasma display panel (PDP). At an end of a display panel 701, a flexible circuit board 702 is electrically connected to a leader line from wiring lines formed into a matrix in the panel via an anisotropic conductive film. On a side opposed to a side of the flexible circuit board 702 connected to the display panel 701, a driver board 703 that includes an electric circuit mounted thereon to control driving is electrically connected. A driver integrated circuit (IC) is mounted on each block of the flexible circuit board 702. A number of wiring lines of the flexible circuit board 702 connected to the driver board 703 side is fewer than that connected to the display panel 701 side. The driver board 703 is electrically connected to a control board 704 on which a control circuit is mounted. A number of wiring lines of the driver board 703 connected to the control board 704 is less than that connected to the flexible circuit board 702.

Generally, the display panel 701 and a chassis 705 are fixed to each other by an adhesive. The driver board 703 and the control board 704 are fixed to the backside of the chassis 705 by screws. The driver board 703 is arranged near each side of the display panel 701 since the driver board 703 is electrically and mechanically connected to the display panel 701 via the flexible circuit board 702. The flexile circuit board 702 is expensive, and thus its length has a considerable effect on overall costs of the apparatus.

Japanese Patent Application Laid-Open No. 2006-65120 discusses that a conductive plate for connecting a driving circuit board and a flat display panel with each other includes a bent part extending in a direction along a side face of the display panel. A length of a flexible circuit board can be shortened by connecting the bent part of the conductive plate and an end of the flexile wiring board to which a reinforcing board is fixed, overlapping one another.

A display panel having a large area can use a chassis of a multi-layered structure to maintain strength of the chassis.

However, in the case of the conventional casing structure, the flexible circuit board cannot be sufficiently shortened when the chassis has a multi-layered structure.

As illustrated in FIG. 8, generally, a front cover arranged to surround a peripheral part of a display surface is fixed to flange portions 801 formed at four corners of the chassis by screws. Each flange portion 801 is formed in a position such that the flexible circuit board 702 is not pinched when the front cover is bonded with the flange portions 801.

In the case of the display panel having a large area, fixing the panel only by the flange portions 801 arranged at the four corners provides no satisfactory connection strength. Therefore, the number of flange portions has to be increased. FIG. 9 illustrates an exemplary method for increasing the number of flange portions. According to this method, a large space is set between adjacent flexible circuit boards 702 to arrange a flange portion 706 therein. Thus, even if the flexible circuit board 702 is bent to the backside of the chassis, the chassis and the front cover can be properly fixed together.

In the case of a display panel having high resolution, however, unlike the case of FIG. 9, it is difficult to secure a sufficient space between flexible circuit boards because of an increase in the number of wiring lines.

The present invention is directed to providing a casing structure suited to a display panel of a large area and high resolution.

SUMMARY OF THE INVENTION

The present invention is directed to a casing structure suited to a display panel of a large area and high resolution.

According to an aspect of the present invention, a flat panel display apparatus includes a display panel, a chassis configured to support a backside of the display panel, and a flexible circuit board on which a driving circuit for driving the display panel is mounted. The chassis includes a first flat plate bonded to the display panel on a surface side, and a second flat plate bonded to a front cover arranged on the surface side of the display panel. The flexible circuit board has a first end connected to the display panel and a second end arranged between the first and second flat plates. The second flat plate includes a plurality of flange portions formed to be bonded to the front cover.

According to the exemplary embodiment of the present invention, the strength of the chassis can be maintained and the chassis and the front cover can be surely bonded together. Thus, a flat panel display apparatus having high strength over the entire apparatus can be provided.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

First Exemplary Embodiment

Figure 1:
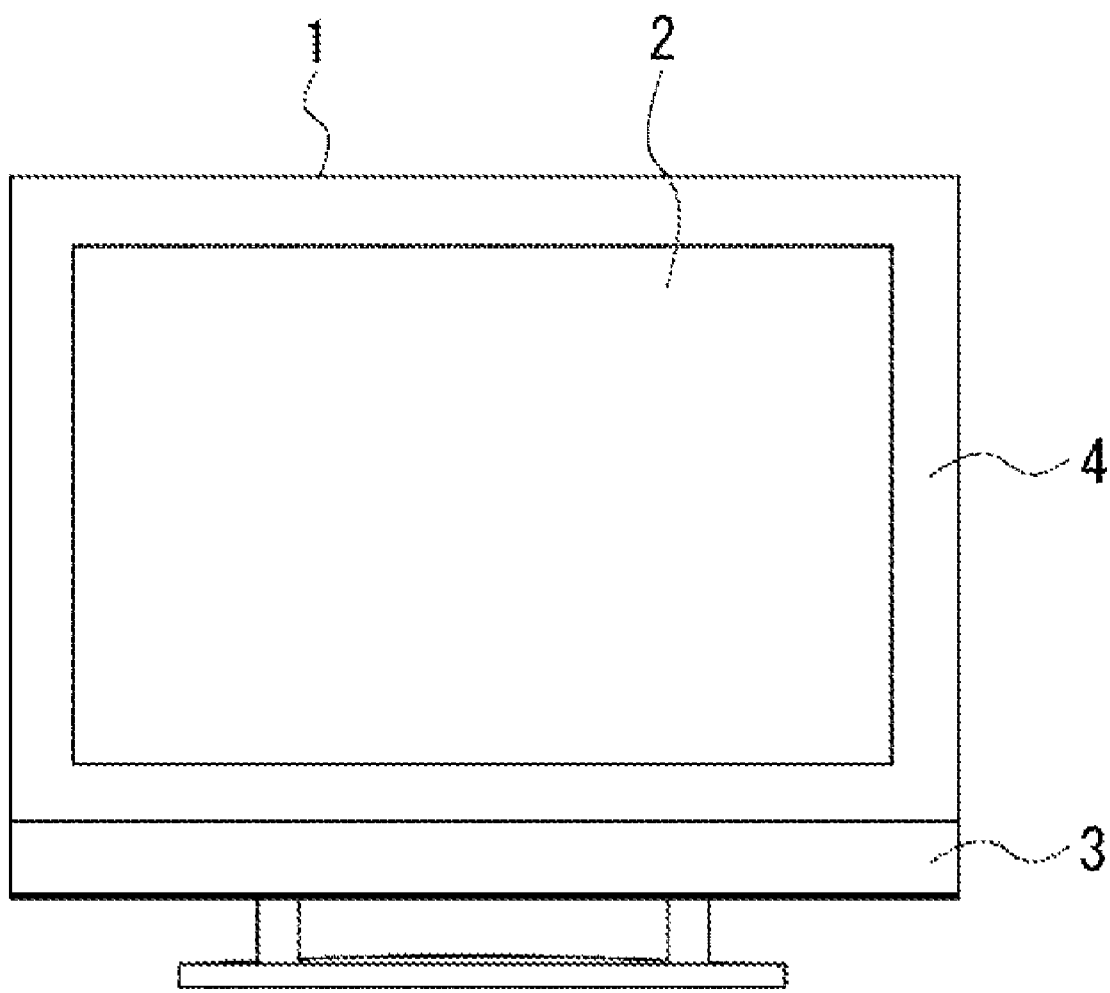
FIG. 1 is a schematic diagram of a television set to which the present invention can be applied.

FIG. 1 is a schematic diagram illustrating a configuration where a flat panel display apparatus of a first exemplary embodiment of the present invention is applied to a television set 1. A front cover 4 protects a peripheral part of a display panel 2. A protective glass 5 (FIG. 2B) for protecting a front of the display panel 2 is bonded to the front cover 4. A speaker 3 is arranged below or on both sides of the display panel 2. The display panel 2 uses a high-resolution PDP where a display area is a diagonal 55" and display resolution (a number of pixels) is (2000×4000). A backside of the display panel includes a display control circuit for controlling display driving of the PDP, an electric circuit for fulfilling a television function, a power source, and so on. Switches, an image/audio input/output (I/O) port, and an antenna I/O necessary for the television set are arranged on the side face or the backside of the television set 1 (not shown).

The present invention can be applied to, in addition to the PDP, a liquid crystal display (LCD), a field emission display (FED), an organic electro luminescence display (organic EL display), and so on.

Figure 2A:
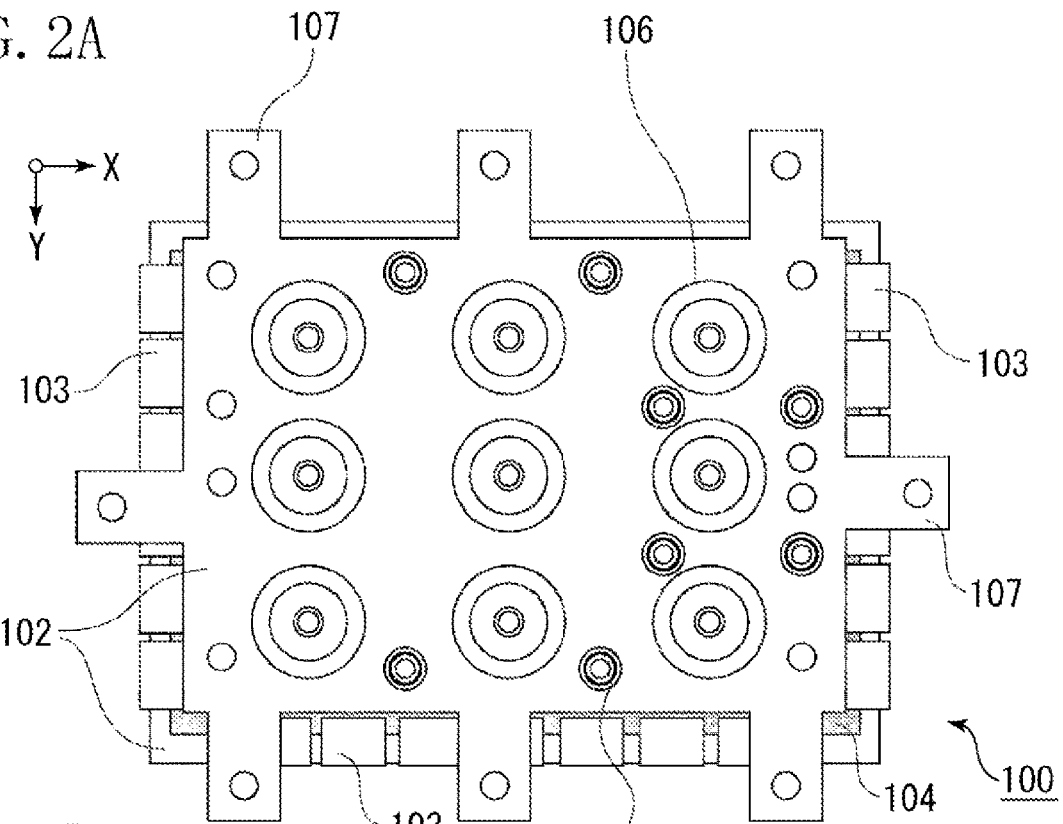
FIGS. 2A and 2B illustrate configurations of a flat panel display apparatus according to a first exemplary embodiment of the present invention.
Figure 2B:
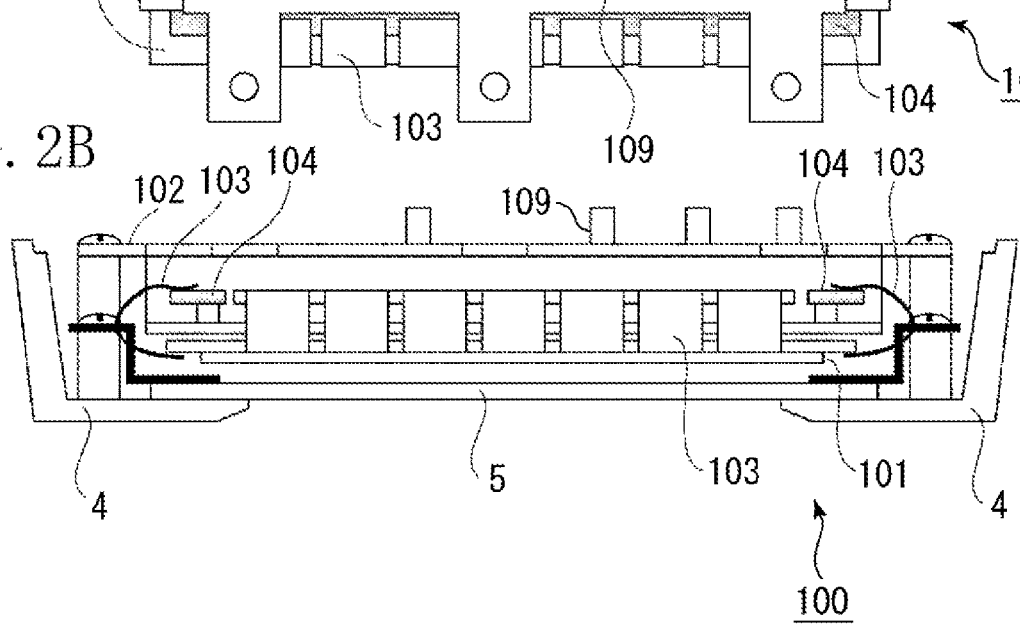

Each of FIGS. 2A and 2B illustrates a configuration of a flat panel display apparatus 100 according to the first exemplary embodiment of the present invention: FIG. 2A illustrating a backside, and FIG. 2B illustrating a side face. The flat panel display apparatus 100 includes a display panel 101, a multi-layered chassis 102, a flexible circuit board 103, and a driver board 104. The multi-layered chassis 102 is formed by integrating two aluminum flat plates. The multi-layered chassis 102 supports a backside of the display panel 101.

A pixel pitch of the display panel 101 is 0.3 mm, a mounting pitch of a bonded part with the flexible circuit board 103 is 0.25 mm, one block includes 128 pixels, a width of the flexible circuit board 103 is 35.5 mm, and a space between the adjacent flexible circuit boards 103 is about 3 mm. The flexible circuit board 103 has one end connected to the display panel 101, and another end arranged between tiers of the multi-layered chassis 102.

A connection pitch between the flexible circuit board 103 and the driver board 104 is 0.5 mm. One block includes 64 connections, and a width of the flexible circuit board 103 in this part is 34 mm. The flexible circuit board 103 and the driver board 104 are electrically and mechanically interconnected by a connector mounted on the driver board 104. The flexible circuit board 103 includes a driving circuit (driver IC) mounted thereon by tape automatic bonding (TAB) to drive the display panel 101. A power supply circuit, an image processing circuit, a system control circuit, and the like are mounted on a circuit board arranged on the backside of the display panel 101 and connected to the driver board 104 by a cable.

Figure 3:
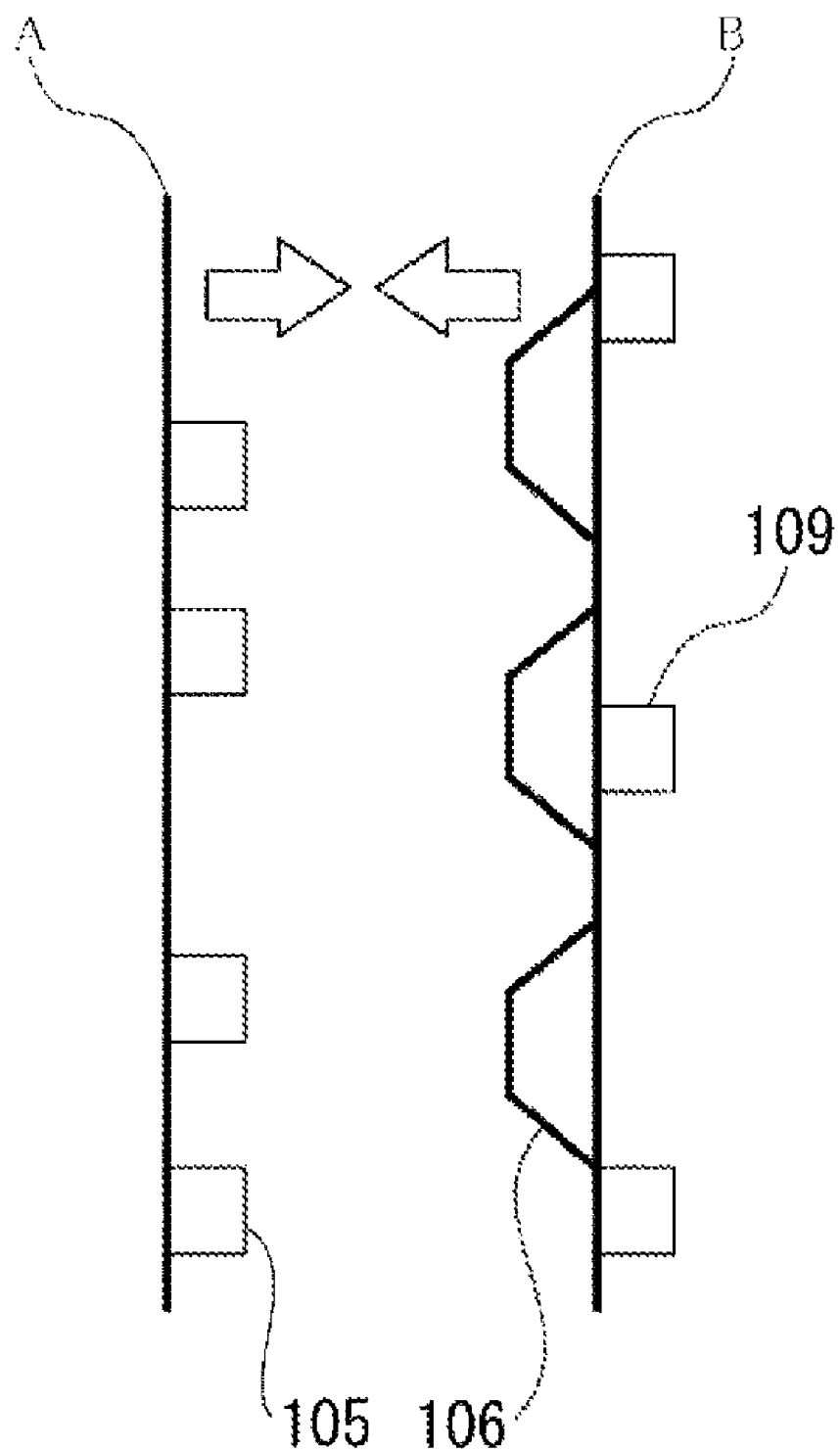
FIG. 3 is a cross-sectional diagram illustrating a structure of a multi-layered chassis.

FIG. 3 is a cross-sectional diagram before integration of the multi-layered chassis 102. Chassis members of the display panel 101 side (surface side) and the backside are respectively referred to as a chassis A (first flat plate) and a chassis B (second flat plate). The chassis A and B are arranged in parallel and integrated to constitute a multi-layered chassis. The chassis A and B both use aluminum flat plates having thicknesses of 1.5 mm as base materials. A surface of the chassis A on the surface side has high flatness so that the display panel 101 can be surely bonded. On the backside of the chassis A, studs 105 are fixed to the chassis A by a mechanical staking process to fix the driver board 104, which is folded and arranged on the backside. Each of the studs 105 has convexity of 5 mm from the backside of the chassis A and has a tap in the center to subsequently fix the driver board 104 by a screw.

The chassis B includes a plurality of diaphragms 106 with a frusto-conical shape as space members to bond with the chassis A at positions that do not overlap the studs 105. Each diaphragm has a height of 10 mm to secure a space of 10 mm between the chassis when the chassis A and B are bonded. The diaphragm has a hole in its center, and the chassis A has a hole which positionally corresponds to the hole in the diaphragm. The chassis A and B are bonded together at the holes by rivets and constitute an integrated multi-layered chassis. The chassis B further includes, at its outer peripheral part, flange portions 107 having holes to bond with the front cover 4, three at an X side (horizontal side) and one at a Y side (vertical side), respectively. The front cover 4 is arranged to surround the surface side of the display panel 101. The front cover 4 includes, in predetermined corresponding places, access holes for screws used for fixing the driver board 104.

The backside of the chassis B includes mounting studs 109 fixed by a mechanical staking process to fix the board on which the power supply circuit or the system control board has been mounted. The driver board 104 is arranged between the chassis A and B to be fixed on the backside of the chassis A. Accordingly, the chassis B is not covered with the flexible circuit board 103 at either of the X or Y side. As a result, a plurality of front cover fixing flange portions 107 can be arranged at desired positions of each side of the chassis B. The use of the multi-layered chassis 102 enables not only achieving of sufficient chassis strength but also bonding of the chassis 102 and the front cover 104 at desired number and positions.

Even if the number of connected wiring lines from the display panel 101 to the flexible circuit board 103 increases, narrowing down of the wiring lines around the outside of the display area in the display panel 101 can be limited to a necessary minimum, and flexible mounting can be carried out without increasing the size of the outer peripheral part of the display area.

Further, even in the case of the multi-layered chassis, the flexible circuit board can be mounted with a length equal to that of a single-layer chassis. Thus, cost increase can be prevented. According to the exemplary embodiment, the bonding of the multi-layered chassis is carried out by rivets. However, the present invention is not limited to the rivet bonding. A process of welding or mechanical staking can also be used.

Second Exemplary Embodiment

As no diaphragm 106 can be arranged on the driver board 104, the diaphragms 106 are arranged nearer the inside by the width of the driver board 104 than the outer peripheral part of the chassis. Therefore, the flange portions 107 may be relatively lengthened and may cause deflection and deformation. A second exemplary embodiment of the present invention is directed to strength improvement of flange portions.

Figure 4:
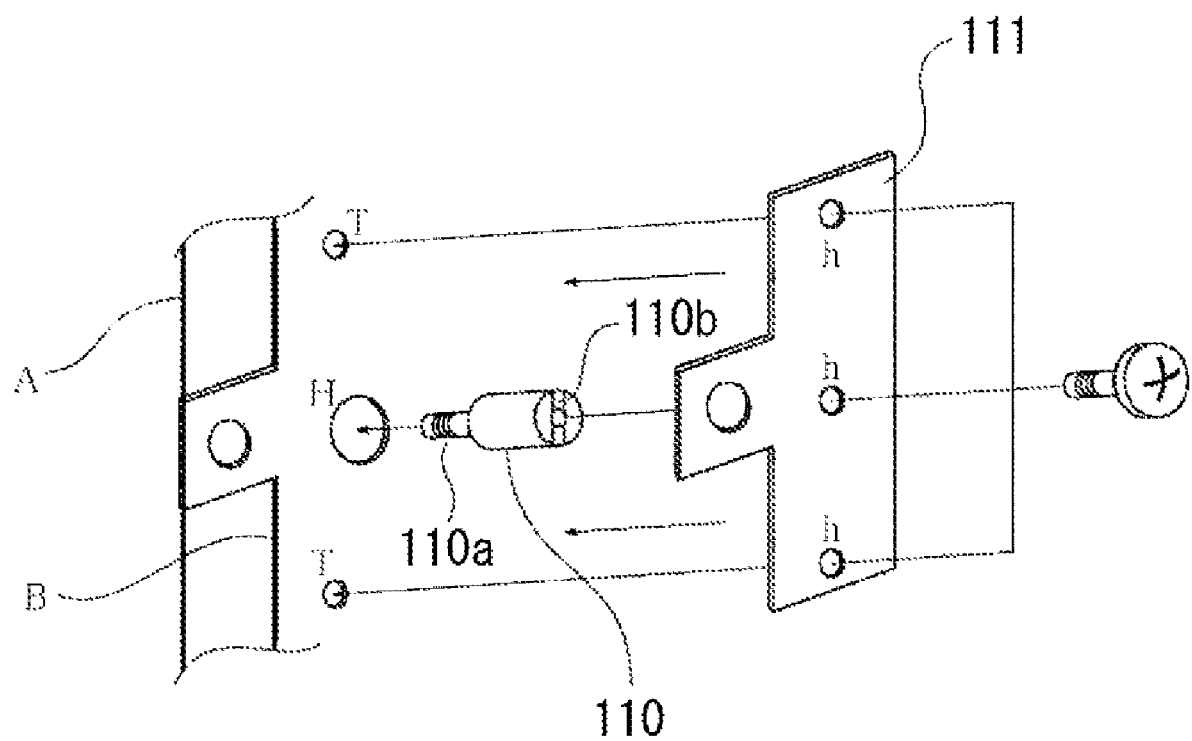
FIG. 4 is a perspective diagram illustrating a configuration of a flat panel display apparatus according to a second exemplary embodiment of the present invention.

As illustrated in FIG. 4, a shaft 110 includes a screw 110a at one end and a slit 110b arranged at another end to rotate the shaft 110. The shaft 110 has a length corresponding to a space between chassis A and B. The chassis B includes a hole H and taps T. The shaft 110 has a diameter smaller than the hole H of the chassis B. A reinforcing plate 111 has a T shape, and holes h corresponding to the hole H and the taps T.

In a fixing process, a driver board 104 is fixed to the chassis A by screws except at a part to which the shaft 110 is attached. Then, the shaft 110 is inserted into the hole H of the chassis B and fastened using the slit 110b on a head. A height of the fastened shaft 110 is equal to a size of a backside of the chassis B. In this state, bonding parts of the driver board 104 are all bonded, a column the shaft 110 stands at a desired position by, and the driver board 104 is held between the chassis A and B. The hole diameter of the chassis B is larger than that of the shaft 110, so that, to bond the chassis B and the shaft 110 together, the shaft 110 and the chassis B are respectively fixed to a reinforcing plate 111 by screws. The reinforcing plate 111 is arranged on a backside to overlap with flange portions of the chassis B. The chassis A and B are fixed together again via the reinforcing plate 111. The reinforcing plate 111 serves to reinforce the flange portions 107 as it extends toward the flange portions 107. Accordingly, the flange portions 107 can be strengthened and reduce deflection of the entire chassis.

According to the present exemplary embodiment, the two types of members are added. However, by inserting a simple cylinder smaller in diameter than the hole H from a side in place of the shaft, and fastening the chassis B with a screw of predetermined length, deflection of the chassis B can be prevented.

Third Exemplary Embodiment

Figure 5:
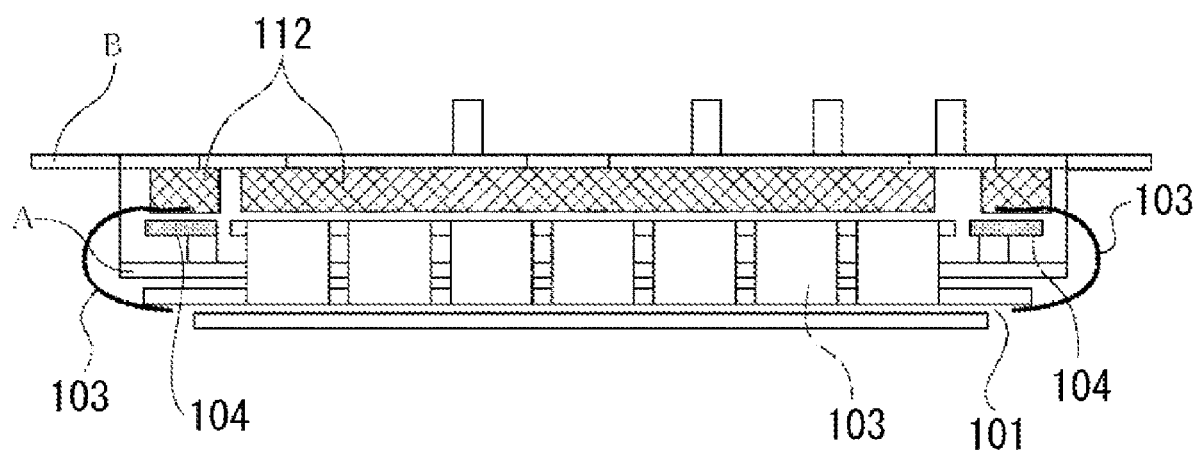
FIG. 5 is a cross-sectional diagram illustrating a configuration of a flat panel display apparatus according to a third exemplary embodiment of the present invention.

According to a third exemplary embodiment of the present invention, as illustrated in FIG. 5, a flexible heat conductor 112 is arranged between chassis A and B.

A driver IC mounted on a flexible circuit board 103 and a control circuit mounted on a driver board 104 generates heat. In the case of the driver IC, a small heat sink is directly mounted. However, a sufficient area cannot be secured because of a limit on a size or a shape of the flexible circuit board 103, resulting in an insufficient heat radiation effect. According to the present exemplary embodiment, by arranging a flexible member having high heat conductivity (heat conductor 112) between the chassis A and B, the chassis B can serve as a heat sink of a large area. As a result, heat around the driver IC can be sufficiently released.

Fourth Exemplary Embodiment

Figure 6:
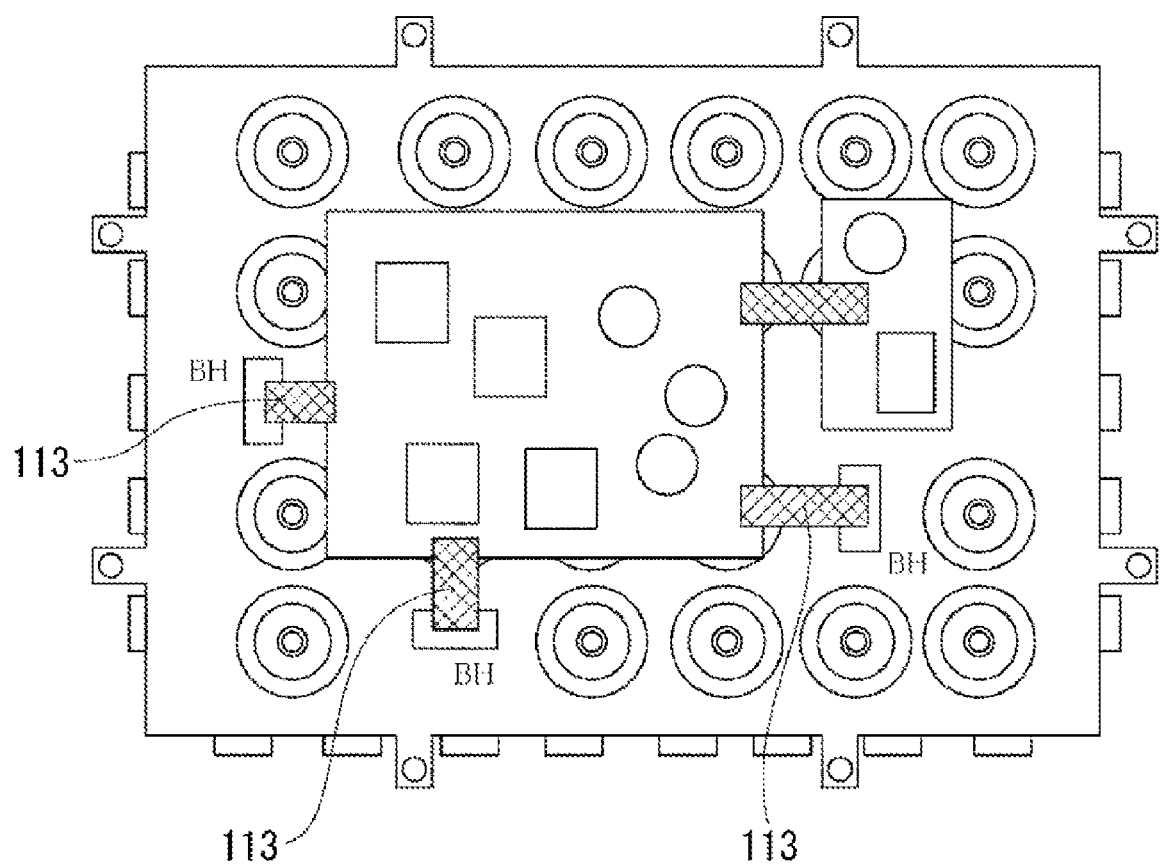
FIG. 6 illustrates a configuration of a flat panel display apparatus according to a fourth exemplary embodiment of the present invention.
Figure 7:
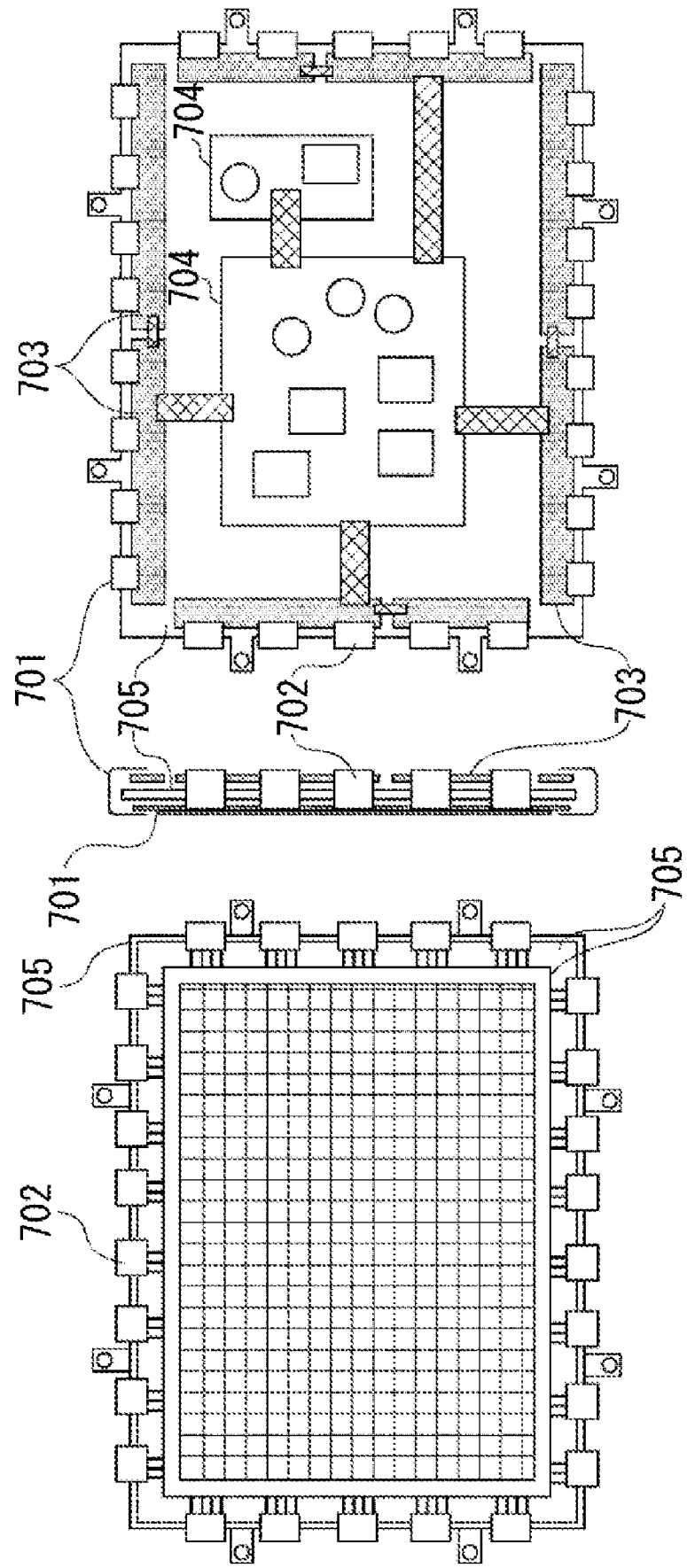
FIG. 7 illustrates a conventional casing structure.
Figure 8:
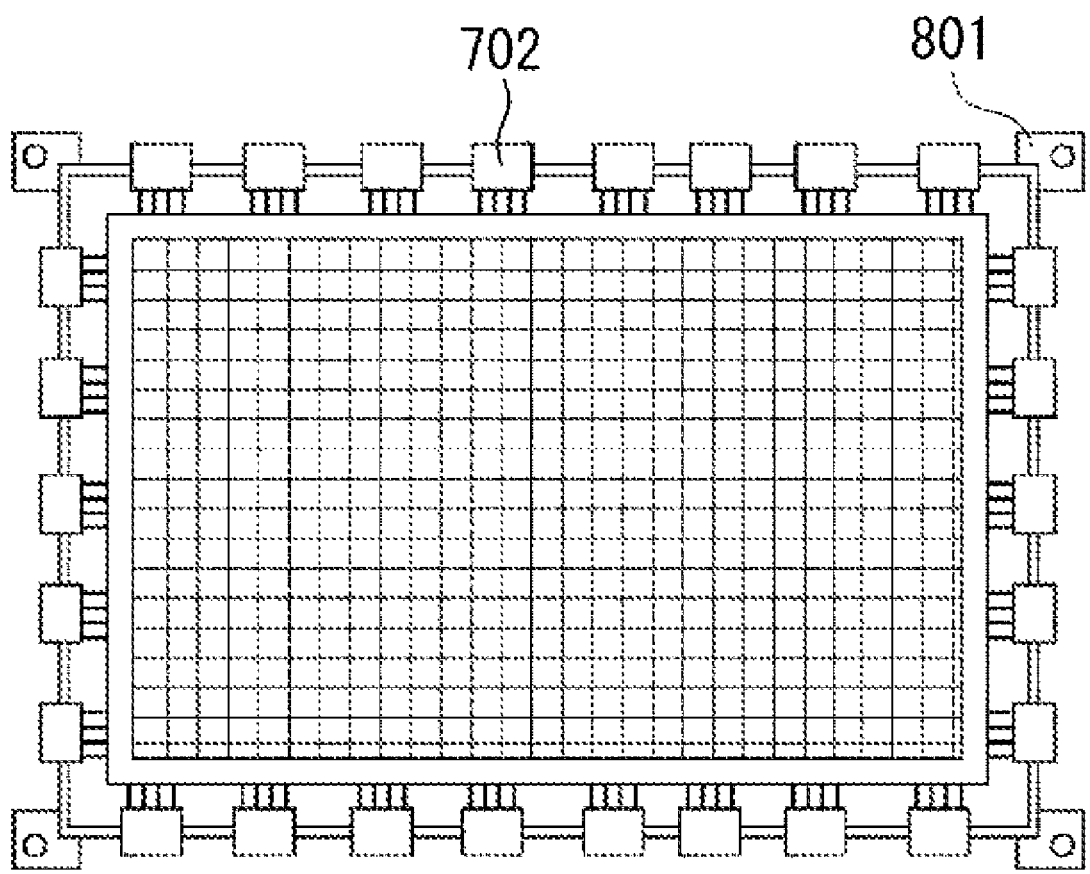
FIG. 8 illustrates a conventional casing structure.
Figure 9:
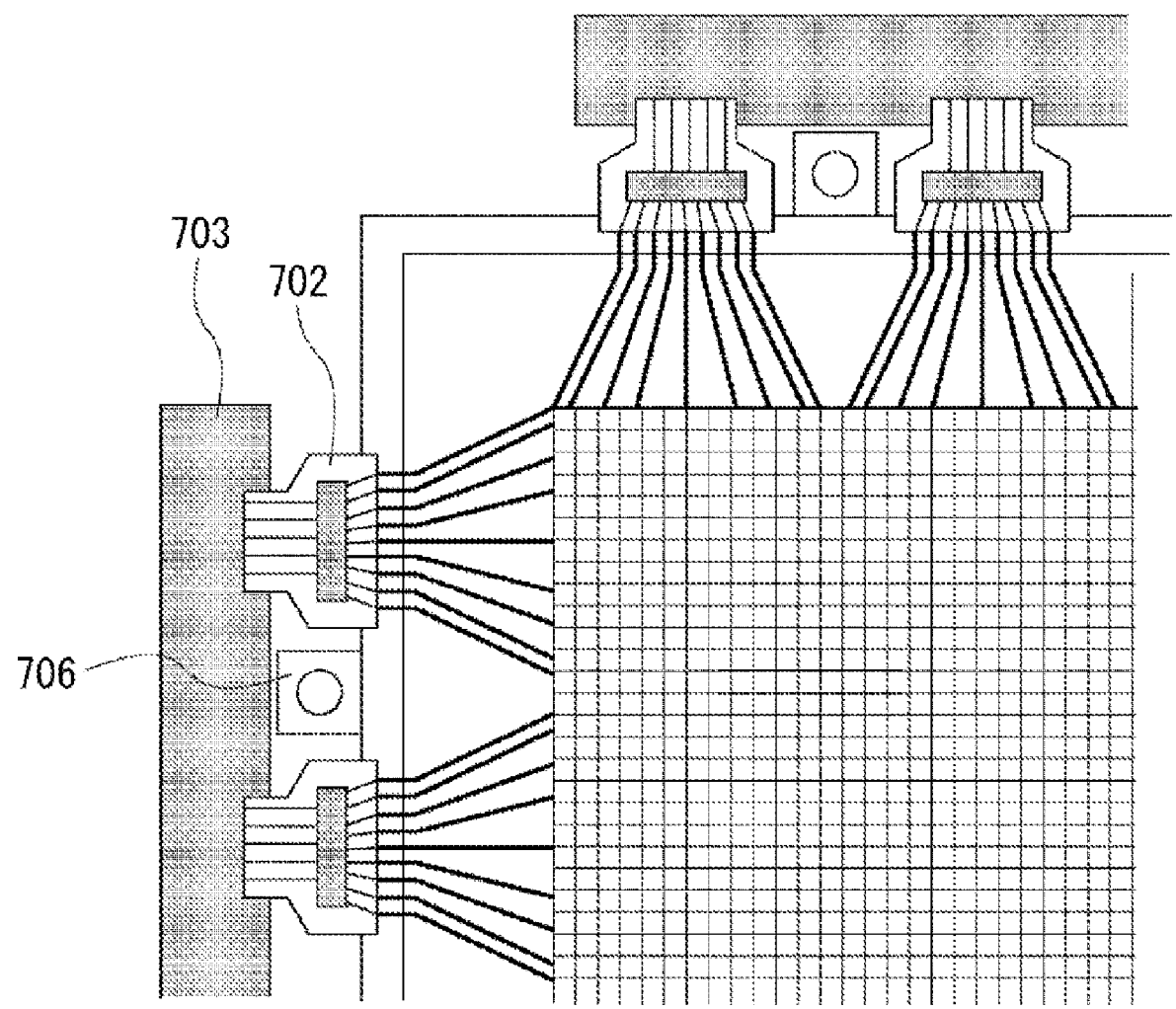
FIG. 9 illustrates a conventional mounting structure.

According to a fourth exemplary embodiment of the present invention, a chassis B includes a through-hole through which a cable can penetrate for electrically interconnecting a driver board and a system control board. As illustrated in FIG. 6, the chassis B includes a through-hole BH arranged on its backside to thread a cable 113. The cable 113 and a driver board 104 are connected by a connector. The driver board 104 is mounted between chassis A and B. If the driver board 104 is fixed first, connection between the cable 113 and the driver board 104 becomes difficult. Thus, the cable 113 is first put through the through-hole BH of the chassis B and connected with the driver board 104. The cable can be shortened, so that cost reduction and simplification of a wiring process can be achieved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-072497 filed Mar. 20, 2007, which is hereby incorporated by reference herein in its entirety.

What is claimed is:

1. A flat panel display apparatus comprising:
a display panel;
a front cover configured to protect a peripheral part of the display panel;
a plurality of flexible circuit boards connected to the display panel; and
a chassis configured to support a backside of the display panel, the chassis including a first flat plate fixed to the backside of the display panel, and a second flat plate fixed to the front cover, the chassis being formed by integrating the first flat plate and the second flat plate, the first flat plate being arranged between the display panel and the second flat plate, a first circuit board being mounted on the backside of the first flat plate, a second circuit board being mounted on the backside of the second flat plate, the first circuit board being connected with the second circuit board, and the first circuit board being arranged between the first flat plate and the second flat plate,
wherein each of the plurality of flexible circuit boards has a first end connected to the display panel and a second end connected to the first circuit board mounted on the backside of the first flat plate, and
wherein at least one flange portion to be fixed to the front cover is formed at each of four outer peripheral sides of the second flat plate.

2. The flat panel display apparatus according to claim 1, wherein the first flat plate includes studs arranged to fix the first circuit board, and the second flat plate includes a plurality of space members formed at positions not overlapping with the studs to bond with the first flat plate.

3. The flat panel display apparatus according to claim 1, further comprising a heat conductor between the first and second flat plates.

4. The flat panel display apparatus according to claim 1, wherein the second flat plate includes a through-hole through which a cable can penetrate to connect the first circuit board with the second circuit board.

5. A flat panel display apparatus comprising:
a display panel;
a front cover configured to protect a peripheral part of the display panel;
a plurality of flexible circuit boards connected to the display panel;
a chassis configured to support a backside of the display panel, the chassis including a first flat plate fixed to the backside of the display panel, and a second flat plate fixed to the front cover, the chassis being formed by integrating the first flat plate and the second flat plate, the first flat plate being arranged between the display panel and the second flat plate, a first circuit board being mounted on the backside of the first flat plate, a second circuit board being mounted on the backside of the second flat plate, the first circuit board being connected with the second circuit board, and the first circuit board being arranged between the first flat plate and the second flat plate,
wherein each of the plurality of flexible circuit boards has a first end connected to the display panel and a second end connected to the first circuit board mounted on the backside of the first flat plate, and
wherein at least one flange portion to be fixed to the front cover is formed at each of four outer peripheral sides of the second flat plate;
a shaft having a length corresponding to a space between the first and second flat plates, the shaft arranged between the first and second flat plates; and reinforcing members bonded to the shaft and arranged in the flange portions of the backside of the second flat plate to reinforce the flange portions.

6. The flat panel display apparatus according to claim 1, wherein the plurality of flexible circuit boards are arranged along an outer periphery of the display panel at a predetermined interval.

7. The flat panel display apparatus according to claim 1, wherein the first circuit board that is mounted on the backside of the first flat plate includes a driver board, and the second circuit board that is mounted on the backside of the second flat plate includes a system control board connected with the driver board that is mounted on the backside of the first flat plate.

* * * * *